(12) United States Patent
Lin et al.

(10) Patent No.: US 7,571,021 B2
(45) Date of Patent: Aug. 4, 2009

(54) METHOD AND SYSTEM FOR IMPROVING CRITICAL DIMENSION UNIFORMITY

(75) Inventors: Chun-Hung Lin, Taoyuan County (TW); Shy-Jay Lin, Hsin-Chu (TW); Heng-Hsin Liu, Yonghe (TW); Chien-Hsun Lin, Hsin-Chu (TW); Jui-Chung Peng, Hsin-Chu (TW); Yao-Wen Guo, Chaozhou Town (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 73 days.

(21) Appl. No.: 11/674,497

(22) Filed: Feb. 13, 2007

(65) Prior Publication Data

US 2008/0195243 A1 Aug. 14, 2008

(51) Int. Cl.
*G06F 19/00* (2006.01)
*G05B 13/02* (2006.01)

(52) U.S. Cl. ........................... 700/121; 700/51

(58) Field of Classification Search ............ 700/28–33, 700/44, 45, 51, 117–121, 174; 438/5–18
See application file for complete search history.

(56) References Cited

U.S. PATENT DOCUMENTS

| 5,402,367 A | 3/1995 | Sullivan et al. |
| 5,458,732 A | 10/1995 | Butler et al. |
| 5,503,707 A | 4/1996 | Maung et al. |
| 5,661,669 A | 8/1997 | Mozumder et al. |
| 5,838,595 A | 11/1998 | Sullivan et al. |
| 6,066,419 A * | 5/2000 | Wu et al. ............... 430/30 |
| 6,566,016 B1 * | 5/2003 | Ziger ..................... 430/5 |
| 6,873,938 B1 * | 3/2005 | Paxton et al. ........... 702/188 |
| 7,135,344 B2 * | 11/2006 | Nehmadi et al. ......... 438/14 |
| 7,220,990 B2 * | 5/2007 | Aghababazadeh et al. ... 257/48 |
| 7,256,055 B2 * | 8/2007 | Aghababazadeh et al. ... 438/11 |
| 7,335,880 B2 * | 2/2008 | Langer et al. .......... 250/310 |

FOREIGN PATENT DOCUMENTS

EP 1517189 A2 * 3/2005

OTHER PUBLICATIONS

Vivien Chang et al., A Flexible Run-to-Run Process Control System for Advanced Etch Applications, Applied Materials, 6th European AEC/APC Conference, Dublin, Ireland, Apr. 6-8, 2005, 26 pages.
Tool Makers Get an Earful on APC and Standards, Solid State Technology, Delivering Surface Conditioning Technology for Real-World Advantages, Sep. 2003, 2 pages, WaferNews.

(Continued)

*Primary Examiner*—M. N. Von Buhr
(74) *Attorney, Agent, or Firm*—Haynes and Boone, LLP

(57) ABSTRACT

A method for improving critical dimension of a substrate is provided. Manufacturing data of a plurality of critical dimension deviations corresponding to a plurality of areas on the substrate is collected. A plurality of sensitivity data corresponding to the plurality of areas is also collected. A plurality of exposure dosage offsets corresponding to the plurality of areas are calculated based on the plurality of critical dimension deviations and the plurality of sensitivity data.

17 Claims, 6 Drawing Sheets

OTHER PUBLICATIONS

Gabe Barna et al., Wafer-to-Wafer Process Control, TI Technical Journal, MMST—Equipment and Processes, Sep.-Oct. 1992, pp. 76-86.

Andy Coleman et al., Controlling Equipment and Processes in MMST CIM, TI Technical Journal, MMST—CIM, Sep.-Oct. 1992, pp. 128-141.

Oscar D Crisalle et al., Adaptive Control of Photolithography, AIChE Journal, Jan. 1992, vol. 38, No. 1, pp. 1-14, American Institute of Chemical Engineering, New York, New York.

Steven A. Henck, In Situ Real-Time Ellipsometry for Film Thickness Measurement and Control, J. Vac. Sci. Technol. A 10(4), Jul./Aug. 1992, pp. 934-938, American Vacuum Society.

Steven A. Henck et al., In Situ Real-Time Ellipsometry for Real-Time Thickness Measurement and Control, Semiconductor Process Designe Center and Central Research Laboratories, Texas Instrument Incorporate, 1992, pp. 299-308, SPIE vol. 1803.

Graydon B. Larrabee, The Intelligent Microelectronics Factory of the Future, Semiconductor Process & Design Center, Texas Instruments, pp. 30-34, 1991 IEEE/SEMI Int'l Semiconductor Manufacturing Science Symposium.

Sovarong Leang et al., Application of Feed-Forward and Feedback Control to a Photolithography Sequence, Department of Electrical Engineering & Computer Sciences, University of California, IEEE/SEMI Advanced Semiconductor Manufacturing Conference, 1992, pp. 143-147.

Zhi-Min Ling et al., In-Line Supervisory Control in a Photolithographic Workcell, Department of Electrical Engineering and Computer Sciences, University of California, Advanced Techniques for Integrated Circuit Processing, 1990, pp. 660-669, SPIE vol. 1392.

Dr. Mark Liu, APC From a Foundry Perspective, Empowering Innovation, AEC/APC Symposium XV, Sep. 2003, 27 pages.

Sonny Maung et al., Integration of In Situ Spectral Ellipsometry with MMST Machine Control, IEEE Transactions on Semiconductor Manufacturing May 1994, pp. 184-192, vol. 7, No. 2.

J. Przybyla et al., A Fully Integrated Photolithography Workcell, Northwest Integrated Circuits Division, Hewlett-Packard, International Semiconductor Manufacturing Science Symposium, '89, pp. 100-107.

Leveraging the Quantum Nature of Materials, 50th Anniversary Perspectives, Solid State Technology, Delivering Surface Conditioning Technology for Real-World Advantages, Nov. 2007, 19 pages, Pennwell Corporation.

Z. Sui et al., Integrated Process Control Using an In Situ Sensor for Etch, Solid State Technology, Apr. 2002, 4 pages, PennWell Corporation.

Mong-Song Liang, AEC/APC Challenges—Today and in the Future -, Advanced Module Technology Division/RD TSMC, Empowering Innovation, Dec. 7, 2004, 26 pages.

Cheung Sun et al., Run to Run Control Application in Diffusion, Symposium XIV, Sep. 8-10, 2002, 17 pages, Utah.

June-Shien Lin et al., Cu Interconnect Sheet Resistance Enhancement by Advanced Process Control, AEC/APC Symposium XV, Sep. 13-18, 2003, 11 pages, Colorado.

Jonathan Chang, Consideration for APC Strategy Development, AEC/APC Symposium XV, Sep. 13-18, 2003, 13 pages, Colorado.

K. Hui, Ph.D., A Review of Basic Run-to-Run Controllers from an Internal Model Control Perspective, AEC/APC Symposium—Asia, 2004, 25 pages, HsinChu, Taiwan.

C.W. Hsu et al., The Challenges of Implementing APC in the Foundry, AEC/APC Symposium XV1, Sep. 18-23, 2004, 21 pages, Colorado.

Francis Ko et al. Advanced Process Control Through Virtual Metrology, AEC/APC Symposium-Asia, 2005, 12 pages, HsinChu, Taiwan.

C.I. Sun et al., Integrating CVD-Photo-Etch Advanced Process Control, Symposium XIV, Sep. 8-10, 2002, 18 pages, Utah.

* cited by examiner

METHOD AND SYSTEM FOR IMPROVING CRITICAL DIMENSION UNIFORMITY

BACKGROUND

In semiconductor manufacturing technology, it is generally desired that the critical dimension (CD) of various patterns and features exposed on a substrate be relatively uniform across the substrate. CD uniformity may be attributed to a number of factors. One factor is the flatness of the wafer which affects CD uniformity from one field to another field. Another factor is the difference in etch rates between different areas of the wafer.

Typically, a photoresist is deposited and patterned on a substrate, the patterns being limited to the CD. The patterned photoresist can be reworked if the CD of the substrate is not uniform. For example, if CD non-uniformity of a patterned wafer is found during a post-etching inspection (PEI), additional exposure dosage may be applied to rectify the uniformity.

One way of determining CD is by examining CD sensitivity of the substrate. Currently, an average CD sensitivity is used to determine any additional exposure dosage required. The average CD sensitivity represents the average of all CD sensitivities of all local areas on the substrate. However, the CD sensitivity of one area on the substrate may be very different from another area. For example, the CD sensitivity around the edge of a wafer may be different from the CD sensitivity in the center of the wafer.

Therefore, a need exists for a method and a system that take into consideration any differences in local CD sensitivities when determining an exposure dosage.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
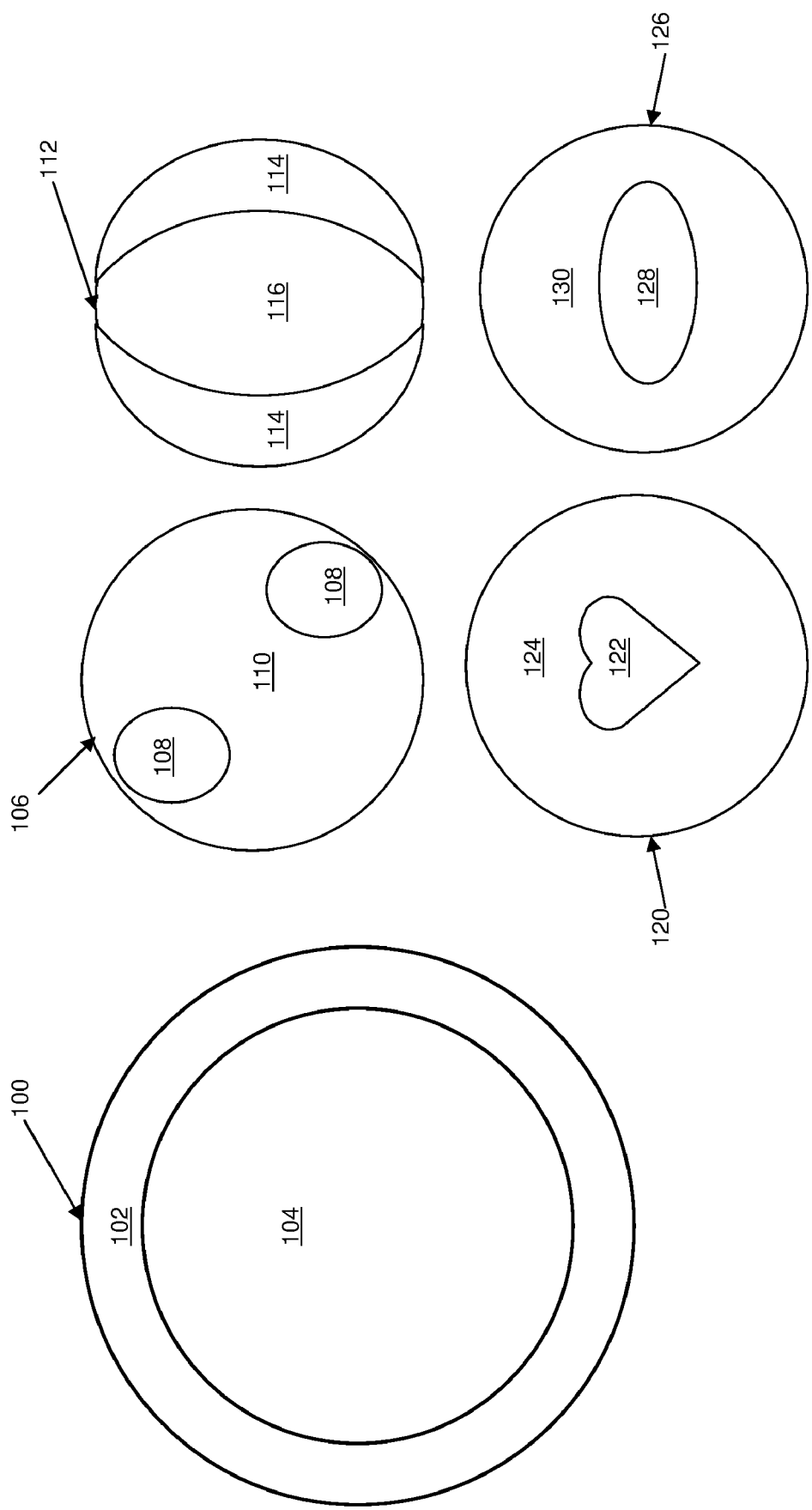
FIG. 1 is a diagram illustrating exemplary CD sensitivity signatures of different etchers.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, a diagram illustrating exemplary CD sensitivity signatures of wafers 100, 106, 112, 120, and 126 resulting from different etchers is depicted. The CD sensitivities of local areas on a wafer can be dependent upon various characteristics of the etcher. For example, in wafer 100, the CD sensitivity of edge area 102 is higher than the CD sensitivity of center area 104. In wafer 106, the CD sensitivities of areas 108, which occupy two opposite ends of the wafer, are higher than the CD sensitivity of the rest of area 110. In wafer 112, the CD sensitivities of areas 114, which occupy the left and right sides of the wafer, are higher than the CD sensitivity of center area 116. In wafer 120, the CD sensitivity of heart-shaped area 122, which occupies the center of the wafer 120, is higher than the CD sensitivity of rest of area 124. In wafer 126, the CD sensitivity of oval-shaped area 128, which occupies center of wafer 126, is higher than the CD sensitivity of rest of the area 130.

While great disparities in CD sensitivity exist among various local areas of a wafer, existing process tools, such as the ASML DoseMapper® tool, only use an average CD sensitivity to determine additional exposure dose required to achieve CD uniformity. The DoseMapper tool provides a real-time graphical user interface, or GUI, that allows the engineer to adjust dose-map configurations and exposure sensitivity to explore the benefits to CD uniformity across the exposure field and wafer.

However, existing process tools, like the ASML DoseMapper tool, merely take the average of CD sensitivities among local areas of a wafer and adjust exposure dosage of each local area by an amount equal to the difference between the CD sensitivity of the local area and the average CD sensitivity. No consideration is taken by existing process tools with regard to the variance of CD sensitivity between local areas.

Aspects of the present disclosure provide a method and a system for improving CD uniformity by optimizing the CD sensitivity for each local area. CD sensitivity may be expressed as a result of the after-development inspection CD (ADI CD) divided by after-etching inspection CD (AEI CD).

Figure 2:
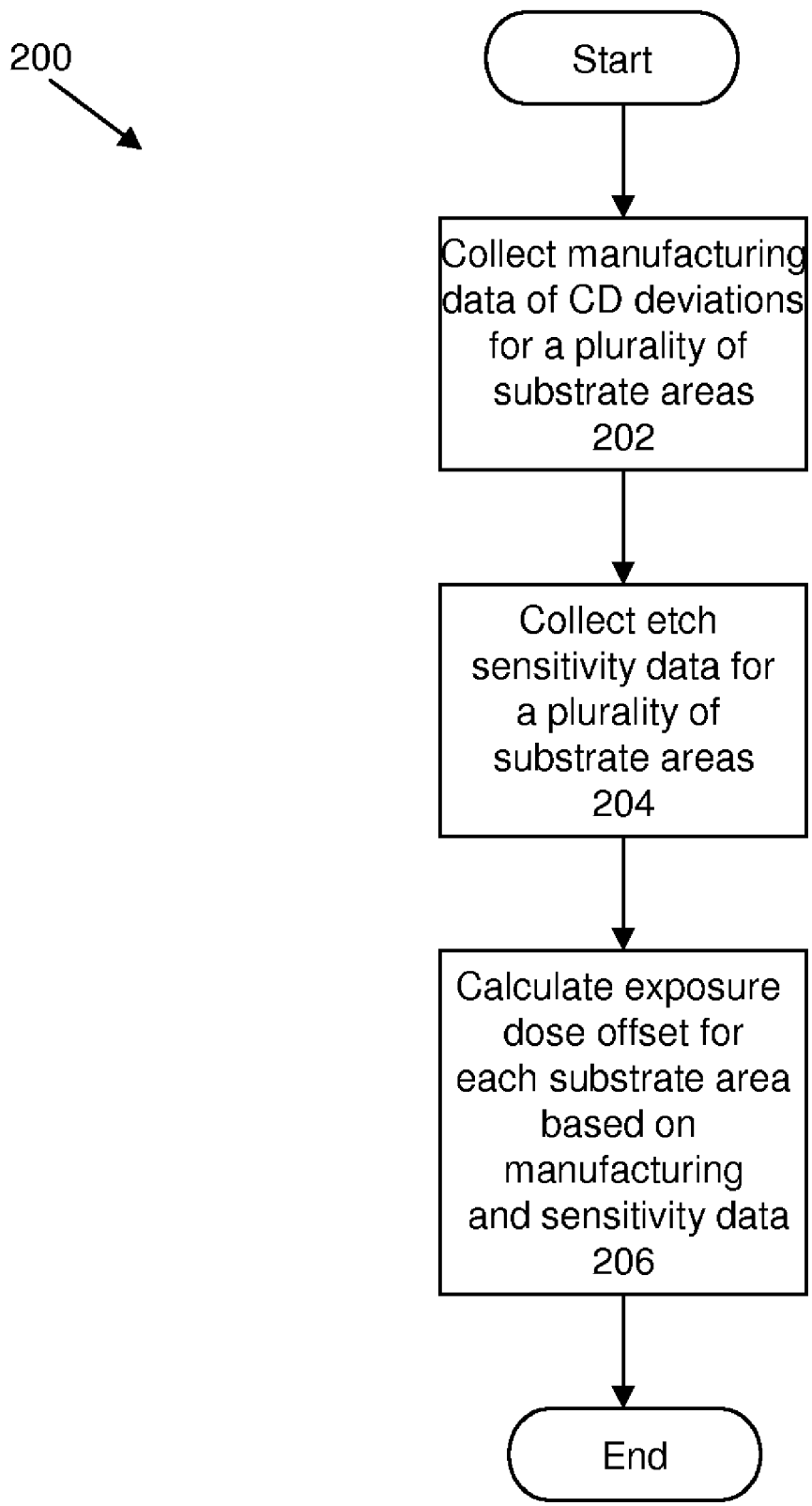
FIG. 2 is a flowchart of an exemplary process for improving CD uniformity.

Referring to FIG. 2, an exemplary process 200 for improving CD uniformity begins at step 202 to collect manufacturing data of a plurality of critical dimension deviations corresponding to a plurality of substrate areas on a wafer. The plurality of critical dimension deviations represents deviations between critical dimensions collected from the manufacturing data and desired critical dimensions.

Next, process 200 continues to step 204 to collect a plurality of etch sensitivity data corresponding to the plurality of substrate areas. The etch sensitivity data comprises CD sensitivity of each substrate area to a specific etcher. At step 206, a plurality of exposure dose offsets are calculated corresponding to the plurality of substrate areas. The plurality of exposure dose offsets are calculated based on the plurality of critical dimension deviations from step 202 and the plurality of etch sensitivity data from step 204.

After the plurality of exposure dose offsets are calculated for the plurality of substrate areas, the exposure dosage for each substrate area is compensated by the amount of exposure dose offset calculated from step 206. By optimizing the CD sensitivity of each substrate area, the CD uniformity of each substrate area may be improved.

Figure 3:
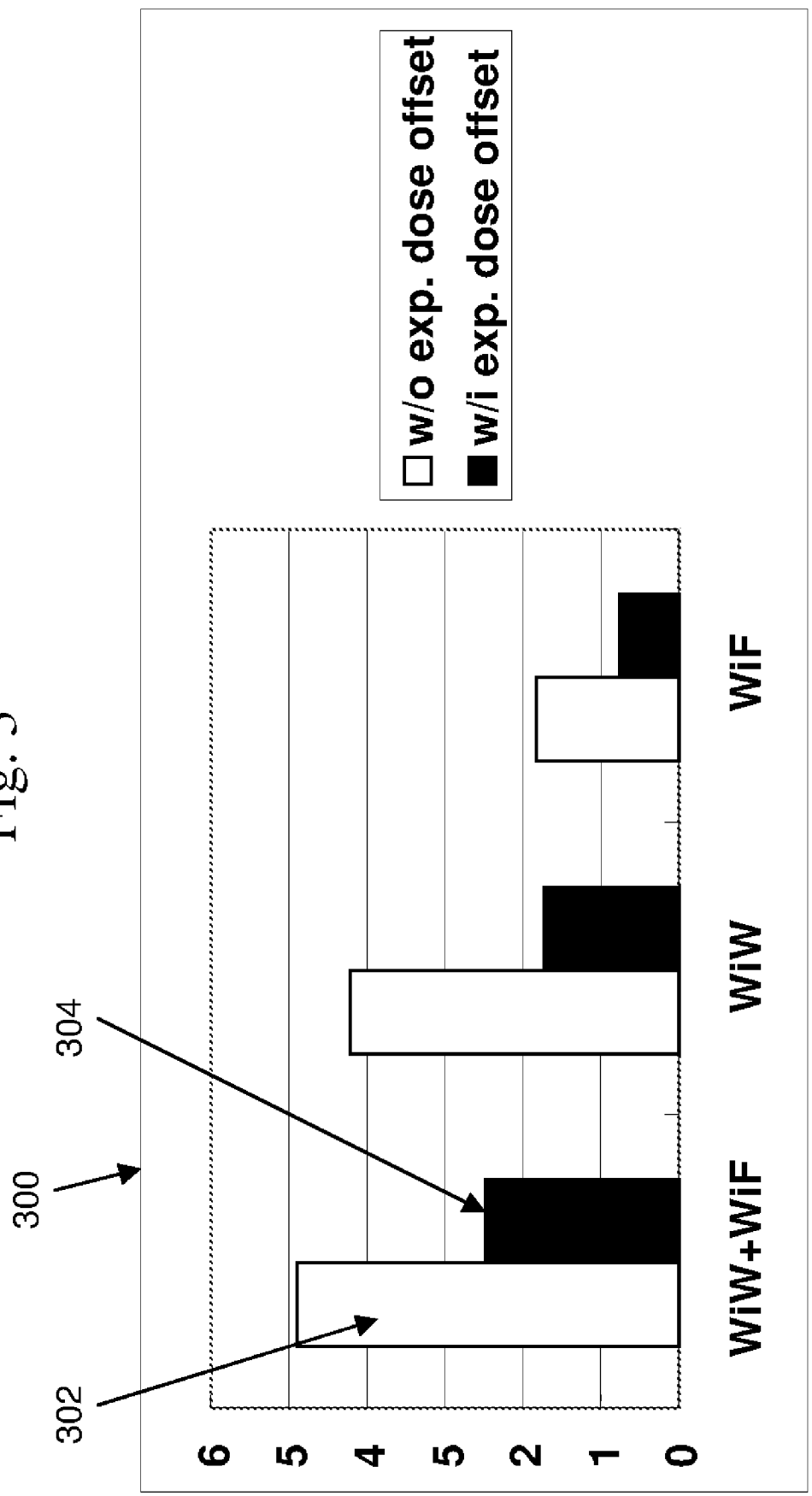
FIG. 3 is a graph illustrating one exemplary CD uniformity improvement by optimizing CD sensitivity of local areas

Referring to FIG. 3, a graph 300 illustrates one exemplary CD uniformity improvement by optimizing CD sensitivity of local areas. Specifically, graph 300 illustrates CD uniformity improvement within-wafer (WiW) and within-field (WiF). In this example, the CD uniformity of prior to exposure dosage offset compensation 302 is about 4.91 nm. After exposure dosage offset compensation is performed for each local area, the CD uniformity 304 is about 2.64 nm. Thus, the CD uniformity improvement is about 46 percent.

Figure 4:
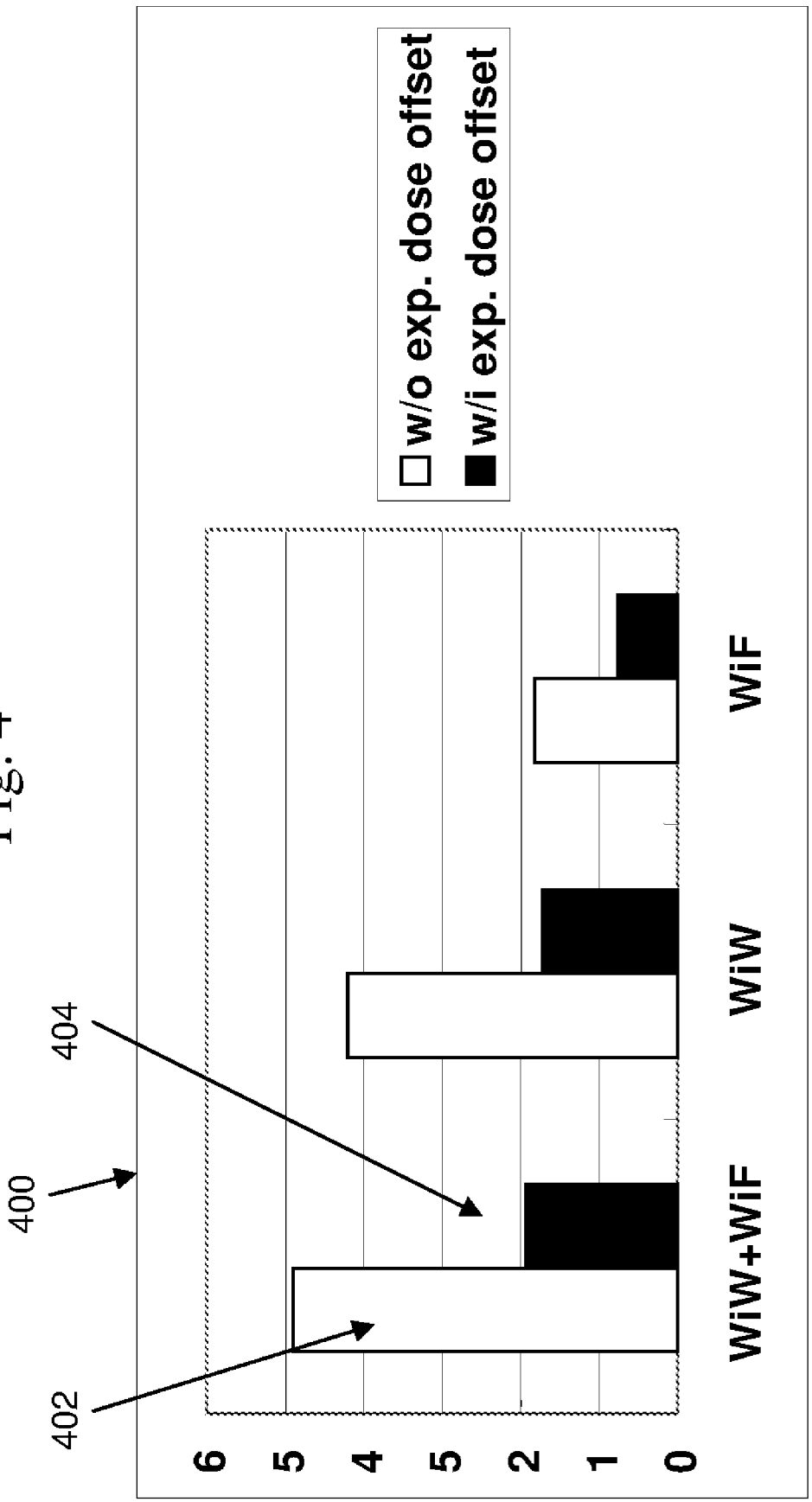
FIG. 4 is a graph illustrating another exemplary CD uniformity improvement by optimizing CD sensitivity of local areas.

Referring to FIG. 4, a graph 400 illustrates another exemplary CD uniformity improvement by optimizing CD sensitivity of local areas. Specifically, graph 400 illustrates CD uniformity improvement for within-wafer (WiW) and within-field (WiF). In this example, the CD uniformity prior to exposure dosage offset compensation 402 is about 4.91 nm. After exposure dosage offset compensation is performed for each local area, the CD 404 is about 1.99 nm. Thus, the CD uniformity improvement is about 59 percent.

Figure 5:
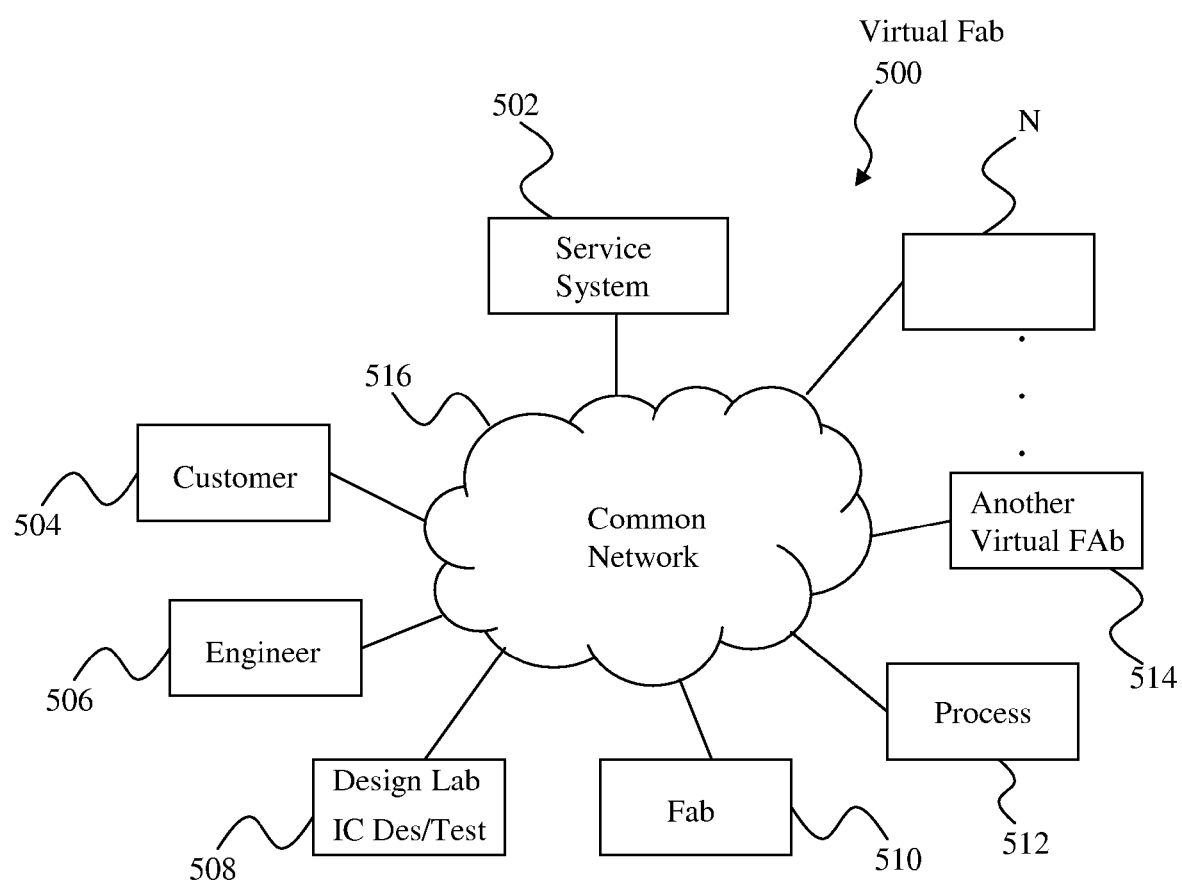
FIG. 5 is a virtual IC fabrication system (a "virtual fab").

Referring now to FIG. 5, a virtual IC fabrication system (a "virtual fab") 500 is illustrated. The virtual fab 500 includes a plurality of entities 502, 504, 506, 508, 510, 512, 514, N that are connected by a communications network 516. The network 516 may be a single network or may be a variety of different networks, such as an intranet and the Internet, and may include both wired and wireless communication channels.

In the present example, the entity 502 represents a service system for service collaboration and provision, the entity 504 represents a customer, the entity 506 represents an engineer, the entity 508 represents a design/laboratory (lab) facility for IC design and testing, the entity 510 represents a fabrication (fab) facility, and the entity 512 represents a process (e.g., an automated fabrication process), and the entity 514 represents another virtual fab (e.g., a virtual fab belonging to a subsidiary or a business partner). Each entity may interact with other entities and may provide services to and/or receive services from the other entities.

For purposes of illustration, each entity 502-512 may be referred to as an internal entity (e.g., an engineer, customer service personnel, an automated system process, a design or fabrication facility, etc.) that forms a portion of the virtual fab 500 or may be referred to as an external entity (e.g., a customer) that interacts with the virtual fab 500. It is understood that the entities 502-512 may be concentrated at a single location or may be distributed, and that some entities may be incorporated into other entities. In addition, each entity 502-512 may be associated with system identification information that allows access to information within the system to be controlled based upon authority levels associated with each entity identification information.

The virtual fab 500 enables interaction among the entities 502-512 for the purpose of IC manufacturing, as well as the provision of services. In the present example, IC manufacturing includes receiving a customer's IC order and the associated operations needed to produce the ordered ICs and send them to the customer, such as the design, fabrication, testing, and shipping of the ICs.

One of the services provided by the virtual fab 500 may enable collaboration and information access in such areas as design, engineering, and logistics. For example, in the design area, the customer 504 may be given access to information and tools related to the design of their product via the service system 502. The tools may enable the customer 504 to perform yield enhancement analyses, view layout information, and obtain similar information. In the engineering area, the engineer 506 may collaborate with other engineers using fabrication information regarding pilot yield runs, risk analysis, quality, and reliability. The logistics area may provide the customer 504 with fabrication status, testing results, order handling, and shipping dates. It is understood that these areas are exemplary, and that more or less information may be made available via the virtual fab 500 as desired.

Another service provided by the virtual fab 500 may integrate systems between facilities, such as between the design/lab facility 508 and the fab facility 510. Such integration enables facilities to coordinate their activities. For example, integrating the design/lab facility 508 and the fab facility 510 may enable design information to be incorporated more efficiently into the fabrication process, and may enable data from the fabrication process to be returned to the design/lab facility 510 for evaluation and incorporation into later versions of an IC. The process 512 may represent any process operating within the virtual fab 500.

Figure 6:
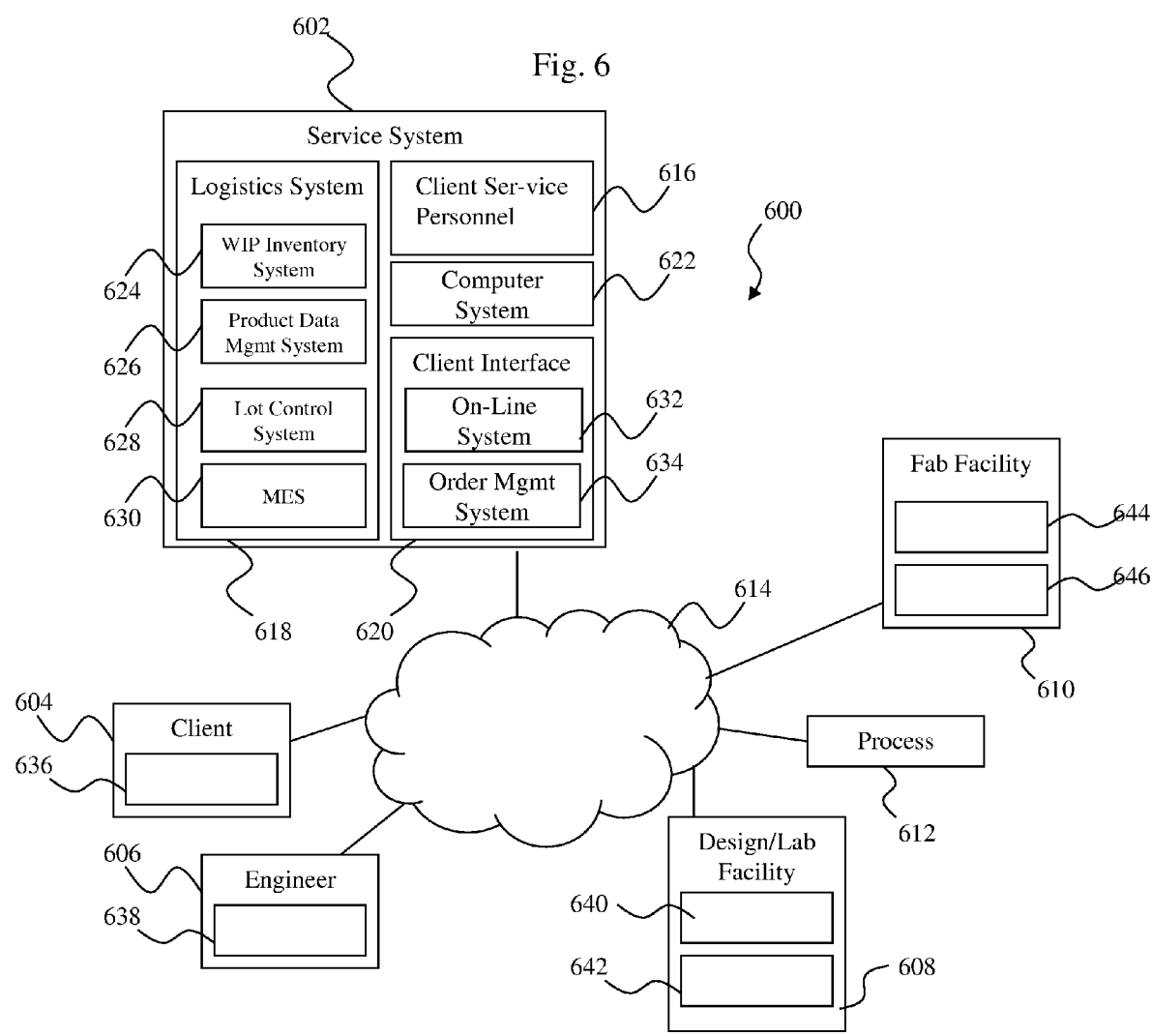
FIG. 6 is one possible implementation of the virtual fab of FIG. 5.

Referring now to FIG. 6, in another embodiment, a virtual fab 600 illustrates one possible implementation of the virtual fab 500 of FIG. 5. The virtual fab 600 includes a plurality of entities 602, 604, 606, 608, 610, and 612 that are connected by a communications network 614. In the present example, the entity 602 represents a service system, the entity 604 represents a customer, the entity 606 represents an engineer, the entity 608 represents a design/lab facility for IC design and testing, the entity 610 represents a fab facility, and the entity 612 represents a process (e.g., an automated fabrication process). Each entity may interact with other entities and may provide services to and/or receive services from the other entities.

The service system 602 provides an interface between the customer and the IC manufacturing operations. For example, the service system 602 may include customer service personnel 616, a logistics system 618 for order handling and tracking, and a customer interface 620 for enabling a customer to directly access various aspects of an order.

The logistics system 618 may include a work in progress (WIP) inventory system 624, a product data management system 626, a lot control system 628, and a manufacturing execution system (MES) 630. The WIP inventory system 624 may track working lots using a database (not shown). The product data management system 626 may manage product data and maintain a product database (not shown). The product database could include product categories (e.g., part, part numbers, and associated information), as well as a set of process stages that are associated with each category of products. The lot control system 628 may convert a process stage to its corresponding process steps.

The MES 630 may be an integrated computer system representing the methods and tools used to accomplish production. In the present example, the primary functions of the MES 630 may include collecting data in real time, organizing and storing the data in a centralized database, work order management, workstation management, process management, inventory tracking, and document control. The MES 630 may be connected to other systems both within the service system 602 and outside of the service system 602. Examples of MES systems 630 include Promis™ (a product of Brooks Automation Inc. of Massachusetts), Workstream™ (a product of Applied Materials, Inc. of California), Poseidon™ (a product of IBM Corporation of New York), and Mirl-MES™ (a product of Mechanical Industry Research Laboratories of Taiwan). Each MES may have a different application area. For example, Mirl-MES may be used in applications involving packaging, liquid crystal displays (LCDs), and printed circuit boards (PCBs), while Promis, Workstream, and Poseidon may be used for IC fabrication and thin film transistor LCD (TFT-LCD) applications. The MES 630 may include such information as a process step sequence for each product.

The customer interface 620 may include an online system 632 and an order management system 634. The online system 632 may function as an interface to communicate with the customer 604, other systems within the service system 602, supporting databases (not shown), and other entities 606-612. The order management system 634 may manage client orders and may be associated with a supporting database (not shown) to maintain client information and associated order information.

Portions of the service system 602, such as the customer interface 620, may be associated with a computer system 622 or may have their own computer systems. In some embodiments, the computer system 622 may include multiple computers (FIG. 6), some of which may operate as servers to provide services to the customer 604 or other entities. The service system 602 may also provide such services as identification validation and access control, both to prevent unauthorized users from accessing data and to ensure that an authorized customer can access only their own data.

The customer 604 may obtain information about the manufacturing of its ICs via the virtual fab 600 using a computer system 636. In the present example, the customer 604 may access the various entities 602, 606-612 of the virtual fab 600 through the customer interface 620 provided by the service system 602. However, in some situations, it may be desirable to enable the customer 604 to access other entities without going through the customer interface 620. For example, the customer 604 may directly access the fab facility 610 to obtain fabrication related data.

The engineer 606 may collaborate in the IC manufacturing process with other entities of the virtual fab 600 using a computer system 638. The virtual fab 600 enables the engineer 606 to collaborate with other engineers and the design/lab facility 608 in IC design and testing, to monitor fabrication processes at the fab facility 610, and to obtain information regarding test runs, yields, etc. In some embodiments, the engineer 606 may communicate directly with the customer 604 via the virtual fab 600 to address design issues and other concerns.

The design/lab facility 608 provides IC design and testing services that may be accessed by other entities via the virtual fab 600. The design/lab facility 608 may include a computer system 640 and various IC design and testing tools 642. The IC design and testing tools 642 may include both software and hardware.

The fab facility 610 enables the fabrication of ICs. Control of various aspects of the fabrication process, as well as data collected during the fabrication process, may be accessed via the virtual fab 600. The fab facility 610 may include a computer system 644 and various fabrication hardware and software tools and equipment 646. For example, the fab facility 610 may include an ion implantation tool, a chemical vapor deposition tool, a thermal oxidation tool, a sputtering tool, and various optical imaging systems, as well as the software needed to control these components.

The process 612 may represent any process or operation that occurs within the virtual fab 600. For example, the process 612 may be an order process that receives an IC order from the customer 604 via the service system 602, a fabrication process that runs within the fab facility 610, a design process executed by the engineer 606 using the design/lab facility 608, or a communications protocol that facilities communications between the various entities 602-612.

It is understood that the entities 602-612 of the virtual fab 600, as well as their described interconnections, are for purposes of illustration only. For example, it is envisioned that more or fewer entities, both internal and external, may exist within the virtual fab 600, and that some entities may be incorporated into other entities or distributed. For example, the service system 602 may be distributed among the various entities 606-610.

One aspect of the present disclosure may be implemented within the MES 630 to collect manufacturing data from a process tool in real time. The manufacturing data may comprise a plurality of critical dimension deviations that are measured for a plurality of substrate areas on the wafer. In addition, another aspect of the present disclosure may be implemented within the MES 630 to collect etching sensitivity data corresponding to the plurality of substrate areas.

Once the data is collected by MES 630, the engineer 606 may use computer system 638 to calculate the plurality of exposure dosage offsets corresponding to the plurality of substrate areas. Once the plurality of exposure dosage offsets are calculated, the exposure dosage offsets may be applied to a software tool, such as an ASML DoseMapper®, in the fab facility 610 to adjust the exposure dosage for each local area. The exposure dosage offsets may be applied by adjusting the recipe of the manufacturing equipment, a process implemented in fab facility 610, or a product in which the process is applied, or a combination thereof.

In summary, a method and a system are provided for improving CD uniformity by optimizing the CD sensitivity for each local area of a substrate. In one embodiment, the method comprises collecting manufacturing data of a plurality of critical dimension deviations corresponding to a plurality of areas on the substrate, collecting a plurality of sensitivity data corresponding to the plurality of areas, and calculating a plurality of exposure dosage offsets corresponding to the plurality of areas based on the plurality of critical dimension deviations and the plurality of sensitivity data. In addition, the plurality of exposure dosage offsets is applied to the plurality of areas.

The plurality of critical dimension deviations represents deviations between critical dimensions collected from manufacturing equipment and desired critical dimensions. The plurality of sensitivity data are expressed as a result of after-development inspection critical dimension (ADI CD) divided by after-etching inspection critical dimension (AEI CD). To apply the plurality of exposure dosage offsets to the plurality of areas, a recipe of manufacturing equipment in a fab facility may be adjusted to apply the plurality of exposure dosage offsets. A process may be implemented within a fab facility to apply the plurality of exposure dosage offsets. In addition, a process may be applied to a product manufactured in a fab facility to apply the plurality of exposure dosage offsets.

In another embodiment, a system for improving critical dimension uniformity of a substrate is provided. The system comprises a manufacturing execution system for collecting data for a plurality of areas on the substrate; a data processing system for calculating a plurality of exposure dosage offsets corresponding to the plurality of areas based on the data; and a software tool executing in a data processing system of a fab facility for adjusting exposure dosage to the plurality of areas based on the plurality of exposure dosage offsets.

The manufacturing execution system is operable to collect a plurality of critical dimension deviations corresponding to the plurality of areas, and a plurality of critical dimension sensitivities corresponding to the plurality of areas. The software tool is operable to adjust a process recipe of a manufacturing equipment in a fab facility to apply the plurality of exposure dosage offsets, adjust a process implemented within a fab facility to apply the plurality of exposure dosage offsets, and apply a process to a product manufactured in a fab facility for applying the plurality of exposure dosage offsets.

Although only a few exemplary embodiments of this invention have been described in detail above, those skilled in the art will readily appreciate that many modifications are possible in the exemplary embodiments without materially departing from the novel teachings and advantages of this invention. It is understood that various different combinations of the above-listed steps can be used in various sequences or in parallel, and there is no particular step that is critical or required. Also, features illustrated and discussed above with respect to some embodiments can be combined with features illustrated and discussed above with respect to other embodiments. Accordingly, all such modifications are intended to be included within the scope of this invention.

What is claimed is:

1. A method for improving critical dimension of a substrate, the method comprising:
    collecting manufacturing data of a plurality of critical dimension deviations corresponding to a plurality of areas on an initial substrate;
    collecting a plurality of sensitivity data corresponding to the plurality of areas;
    calculating a plurality of exposure dosage offsets corresponding to the plurality of areas based on the plurality of critical dimension deviations and the plurality of sensitivity data; and
    applying the plurality of exposure dosage offsets to a plurality of areas of a next substrate.

2. The method of claim 1, wherein the plurality of sensitivity data represent critical dimensions sensitivity of the plurality of areas to an etcher.

3. The method of claim 1, wherein the plurality of critical dimension deviations represent deviations between critical dimensions collected from manufacturing equipment and desired critical dimensions.

4. The method of claim 1, wherein the plurality of sensitivity data are expressed as a result of after-development inspection critical dimension (ADI CD) divided by after-etching inspection critical dimension (AEI CD).

5. The method of claim 1, wherein applying the plurality of exposure dosage offsets to the plurality of areas comprises adjusting a process recipe of manufacturing equipment in a fab facility to apply the plurality of exposure dosage offsets.

6. The method of claim 1, wherein applying the plurality of exposure dosage offsets to the plurality of areas comprises adjusting a process implemented within a fab facility to apply the plurality of exposure dosage offsets.

7. The method of claim 1, wherein applying the plurality of exposure dosage offsets to the plurality of areas comprises applying a process to a product manufactured in a fab facility for applying the plurality of exposure dosage offsets.

8. The method of claim 1, wherein the plurality of areas represent a plurality of fields within the substrate.

9. A method for manufacturing an integrated circuit, the method comprising:
    collecting manufacturing data for a plurality of areas on a substrate;
    determining a critical dimension sensitivity for each of the plurality of areas;
    identifying an exposure dosage offset for each of the plurality of areas based on the critical dimension sensitivity; and
    implementing an exposure processing on a plurality of areas on a next substrate using the exposure dosage offset for each of the plurality of areas.

10. The method of claim 9, wherein the manufacturing data comprises a plurality of critical dimension offsets corresponding to the plurality of areas.

11. The method of claim 10, wherein the plurality of critical dimension offsets represents a plurality of deviations between critical dimensions collected from manufacturing equipment and desired critical dimensions.

12. The method of claim 9, wherein determining a critical dimension sensitivity for each of the plurality of areas comprises:
    determining an after-development inspection critical dimension (ADI CD);
    determining an after-etching inspection critical dimension (AEI CD); and
    dividing the after-development inspection critical dimension by the after-etching inspection critical dimension.

13. The method of claim 9, wherein the critical dimension sensitivity represents critical dimension sensitivity of each of the plurality of areas to an etcher.

14. A system for improving critical dimension uniformity of a substrate comprising:
    a manufacturing execution system for collecting data for a plurality of areas on an initial substrate, including a plurality of critical dimension deviations corresponding to the plurality of areas and a plurality of critical dimension sensitivities corresponding to the plurality of areas;
    a data processing system for calculating a plurality of exposure dosage offsets corresponding to the plurality of areas based on the data; and
    a software tool executing in the data processing system of a fab facility for applying the plurality of exposure dosage offsets to a plurality of areas of a next substrate.

15. The system of claim 14, wherein the software tool is operable to adjust a process recipe of manufacturing equipment in the fab facility to apply the plurality of exposure dosage offsets.

16. The system of claim 14, wherein the software tool is operable to adjust a process implemented within the fab facility to apply the plurality of exposure dosage offsets.

17. The method of claim 14, wherein the software tool is operable to apply a process to a product manufactured in the fab facility for applying the plurality of exposure dosage offsets.

* * * * *